US006430721B2

(12) United States Patent
Kajala et al.

(10) Patent No.: US 6,430,721 B2
(45) Date of Patent: *Aug. 6, 2002

(54) METHOD FOR DECREASING THE FRAME ERROR RATE IN DATA TRANSMISSION IN THE FORM OF DATA FRAMES

(75) Inventors: Matti Kajala; Janne Vainio, both of Tampere (FI)

(73) Assignee: Nokia Mobile Phones Limited, Espoo (FI)

( * ) Notice: Subject to any disclaimer, the term of this patent is extended or adjusted under 35 U.S.C. 154(b) by 0 days.

This patent is subject to a terminal disclaimer.

(21) Appl. No.: 09/730,288

(22) Filed: Dec. 5, 2000

Related U.S. Application Data

(63) Continuation of application No. 09/057,680, filed on Apr. 9, 1998, now Pat. No. 6,178,535.

(30) Foreign Application Priority Data

Apr. 10, 1997 (FI) .................................................. 971484

(51) Int. Cl.[7] .............................................. H03M 13/00
(52) U.S. Cl. ...................................................... 714/752
(58) Field of Search ................................ 714/752, 758, 714/786, 746

(56) References Cited

U.S. PATENT DOCUMENTS

| 5,073,940 A | 12/1991 | Zinser .......................... 381/47 |
| 5,170,396 A | 12/1992 | Rivers et al. ................ 714/709 |
| 5,327,439 A | 7/1994 | Estola et al. ................. 714/790 |

(List continued on next page.)

FOREIGN PATENT DOCUMENTS

| DE | 195 03 528 A1 | 8/1996 |
| EP | 0 540 231 A2 | 5/1993 |
| EP | 0 643 493 A1 | 3/1995 |
| EP | 0 660 558 A3 | 6/1995 |
| EP | 0 682 415 A1 | 11/1995 |
| GB | 2 294 616 A | 5/1996 |
| GB | 2 308 044 | 6/1997 |

(List continued on next page.)

OTHER PUBLICATIONS

Burkert, F., et al., "Turbo Decoding With Unequal Error Protection Applied To GSM Speech Coding", Global Telecommunications Conference (Globecom), US, New York, IEEE, Nov. 18, 1996, pp. 2044–2048.

*Primary Examiner*—Albert Decady
*Assistant Examiner*—Shelly A Chase
(74) *Attorney, Agent, or Firm*—Perman & Green, LLP

(57) ABSTRACT

The invention relates to a method for decreasing the frame error rate of information to be transmitted in the form of data frames in a data transmission system, in which the information to be transmitted is divided into data frames. The data frame is supplemented with error correction data generated by using part of the information to be transferred. At least part of the information to be used in the generation of error correction data is protected by error correction coding, by which an error correction coded data frame is obtained, in which different parts of the protected information have different error rates (BER). The error correction coded data frames are transferred in the data transmission channel from the transmitter to the receiver. The error rates of at least one part of the protected information are levelled out by shaping at the transmission stage that information part which is protected by error correction coding and which is used in the generation of the error correction data.

14 Claims, 6 Drawing Sheets

U.S. PATENT DOCUMENTS

| | | | |
|---|---|---|---|
| 5,349,589 A | 9/1994 | Chennakeshu et al. | 714/795 |
| 5,396,653 A | 3/1995 | Kivari et al. | 455/88 |
| 5,416,787 A | 5/1995 | Kodama et al. | 714/790 |
| 5,420,889 A | 5/1995 | Juntti | 375/346 |
| 5,430,740 A | 7/1995 | Kivari et al. | 371/37.1 |
| 5,557,639 A | 9/1996 | Heikkila et al. | 375/224 |
| 5,563,865 A | 10/1996 | Malkamaki et al. | 714/748 |
| 5,596,624 A | 1/1997 | Armbruster et al. | 379/58 |
| 5,596,677 A | 1/1997 | Jarvinen et al. | 704/220 |
| 5,625,887 A | 4/1997 | Cassidy et al. | 455/54.2 |
| 5,666,370 A | 9/1997 | Ganesan et al. | 714/752 |
| 5,673,291 A | 9/1997 | Dent | 375/262 |
| 5,742,640 A | 4/1998 | Haoui et al. | 375/220 |
| 5,784,392 A | 7/1998 | Czaja et al. | 714/786 |
| 5,796,757 A | 8/1998 | Czaja | 714/789 |
| 5,835,889 A | 11/1998 | Kapanen | 704/215 |
| 5,854,978 A | 12/1998 | Heidari | 455/418 |
| 5,859,840 A | 1/1999 | Tiedemann, Jr. et al. | 370/355 |
| 5,875,202 A | 2/1999 | Venters et al. | 714/807 |
| 5,893,061 A | 4/1999 | Cortz | 704/262 |
| 5,987,639 A | 11/1999 | Kivaria et al. | 714/822 |
| 6,012,025 A | 1/2000 | Yin | 704/219 |

FOREIGN PATENT DOCUMENTS

| | | |
|---|---|---|
| GB | 2 324 934 A | 11/1998 |
| GB | 2 324 937 A | 11/1998 |
| WO | WO 96/23360 | 8/1996 |
| WO | WO97/14235 | 4/1997 |
| WO | WO 97/16899 | 5/1997 |
| WO | WO 97/45976 | 12/1997 |
| WO | WO 97/50218 | 12/1997 |

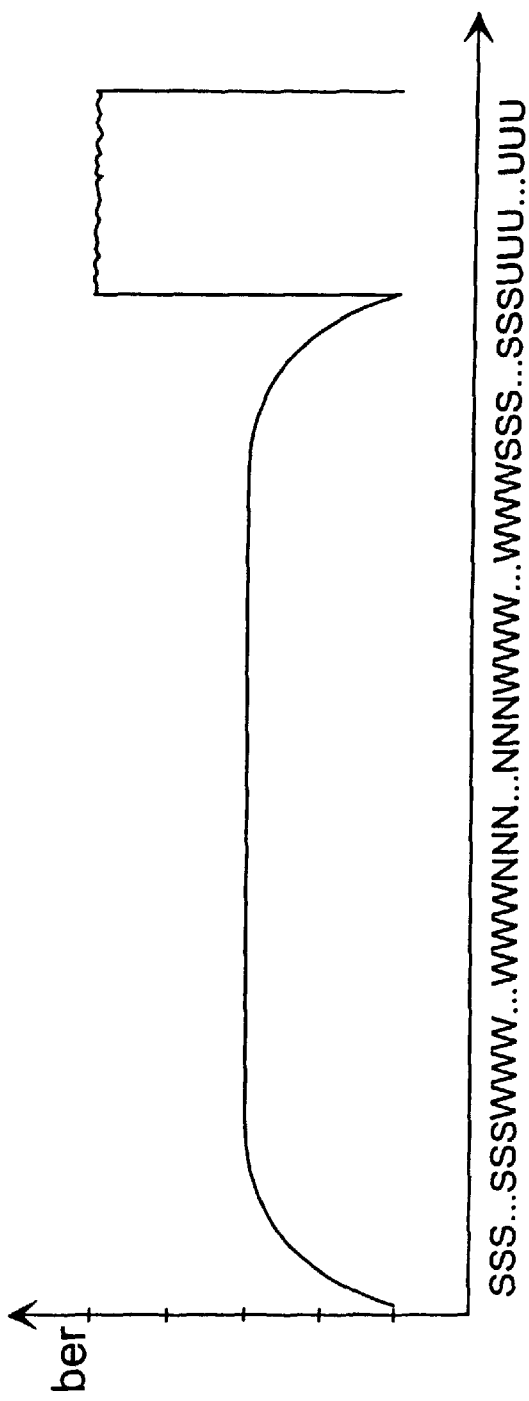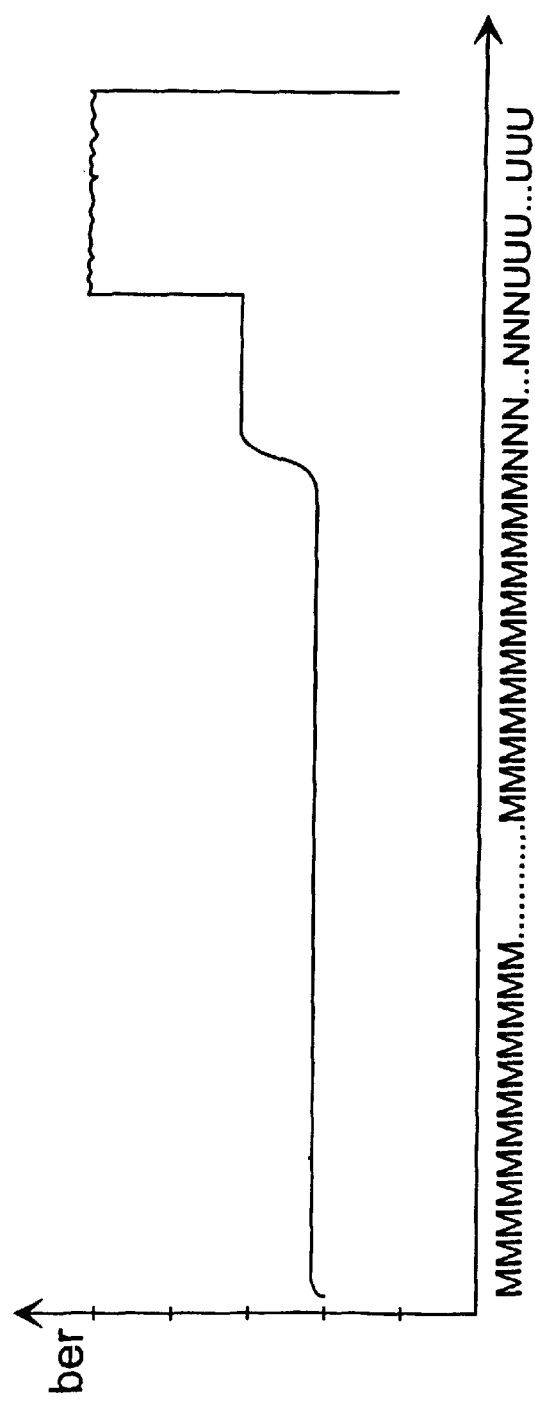

METHOD FOR DECREASING THE FRAME ERROR RATE IN DATA TRANSMISSION IN THE FORM OF DATA FRAMES

This application is a continuation of U.S. appl. Ser. No. 09/057,680, filed Apr. 9, 1998, now U.S. Pat. No. 6,178,535.

FIELD OF THE INVENTION

The present invention relates to a method according to the preamble of the appended Claim 1 for decreasing the frame error rate in a data transmission system in which information is transmitted in the form of data frames. The invention is further related to a data transmission system according to the method and a mobile station according to the preamble of the appended Claim 11.

In data transmission in the form of data frames, the information to be transmitted is divided into data frames of usually regular length. In addition to the primary information, the data frames can also contain title information and other information required in the transmission of data frames. The data frames are transmitted from the transmitter to the receiver via a transmission channel which can comprise e.g. the radio channel or another wireless transmission channel. The transmission channel is exposed to disturbances, such as ignition interference caused by electrical devices, and on the other hand to interference caused by other devices of similar type used in wireless data transmission, such as radio transmitters. Still another considerable cause of disturbance, particularly in movable transmitter/receiver devices, is the fact that the signal to be received can enter the receiver via several routes of different lengths, thus distorting the signal to be received. Therefore, for eliminating transmission errors, error correction data or at least error detection data is usually added to the data frames. One method for adding error correction data is the use of so-called convolutional codes, i.e. the information to be transmitted is coded by using a suitable convolutional code, and the convolutional-coded information is transmitted to the data transmission channel. At the receiving stage, the operation is reversed for separating the transmitted information from the received data transmission stream. The error detecting data used is most commonly parity checking data which is calculated from the information to be transmitted, or at least from part of it. One such known parity checking method is the so-called cyclic redundancy check (CRC). Thus, at the receiving end, the received information is subjected to the corresponding operation, and the parity checking data formed at the receiving end is compared with the received parity checking data. If the data are equivalent, the receiving device concludes that the data was received correctly. If the calculated and received parity data are not equivalent, the receiving device concludes that the received data frame was at least partly incorrect. After this it is possible to request retransmission or to try to decode the incorrect frame e.g. by interpolation.

Using error correction methods, it is possible to correct at least some of the potential transmission errors, wherein re-transmission is not necessary in all error situations. However, when an error checking method is used, only correctness or incorrectness is detected, and re-transmission is requested in an error situation, thus delaying the data transmission. These codes can also be called an outer code and an inner code. Outer coding is conducted before inner coding. Thus, the coding data formed by outer coding is further subjected by inner coding, thus improving the reliability of the transmission. The outer code is usually an error-detecting code and the inner code an error correcting code, but these can also be reversed. The coding can also concatenate more than two codes.

In current digital mobile communication systems, also speech is transferred in the form of data frames. For example in the GSM mobile communication system (Global System for Mobile Communications), in the full rate speech communication channel a majority of the digital information formed of the audio signal is protected by error correction coding. In the speech coder, 260 speech parameter bits are formed for each speech sequence of 20 milliseconds. Of these 260 bits, 182 bits with subjectively greatest significance are protected with an error correction code. These 182 bits are subjected to convolutional coding at a coding rate of 1/2, i.e. two bits to be transmitted to the transmission channel are formed for each information bit. The remaining 78 bits are transmitted with no protection, i.e. possible errors in them are not detected at the receiving stage.

The bit (symbol) error ratio in the received data frames can at times exceed the error correction capacity of the error correction method used in the transmission of the data frames. As a result, all errors cannot be corrected, wherein the most common procedure is to request re-transmission of such data frames or, e.g. in speech coding, to try to form a data frame synthesised on the basis of previously received data frames. Synthesisation of data frames can be used to some extent in the transmission of audio and video signals, but for example in the transmission of data signals, it is not possible to use a synthesised data frame.

When the error correction capacity of the receiver is exceeded, it is important to detect those errors which are still left after error correction. Such incorrect information should not be used in the receiver when reconstructing the transmitted information. For example in the full rate traffic channel in the GSM system, detection of uncorrected errors is conducted by CRC coding by forming three parity checking bits. When forming these parity checking bits, 50 bits from each data frame are used which are the most significant for the information to be transmitted. Thus these 50 data frame bits are subjected to the corresponding operation in the receiver, and the parity checking bits are compared with the parity checking bits transmitted with the data frame, wherein possible changes indicate that there was an error in the data transmission.

In the GSM system, speech decoding will reject all data frames in which it was not possible to correct all errors. These data frames are replaced by a data frame formed on the basis of previously received acceptable data frames. If the number of incorrect data frames is relatively small, the replaced data frames do not impair significantly the quality of the decoded speech signal. However, if the number of incorrect data frames increases, its effect can be gradually clearly audible in the speech signal. This can even lead to the fact that the decoded speech signal is no longer intelligible.

FIG. 1*a* is a block diagram showing a speech coding system according to prior art. This is an example of the full rate speech coding system of the GSM system. FIG. 1*a* is a block diagram showing speech coding, addition of parity checking bits, and convolutional coding. FIG. 4 is a flow chart showing this channel coding used in the transmission of a speech signal of the GSM mobile communication system according to prior art. In the following, the operation of channel coding is shown with reference to the apparatus of FIG. 1*a* and the flow chart of FIG. 4.

The speech signal is divided into frames, or time intervals of certain length, which in this system is 20 milliseconds.

Each frame is coded separately. Thus each speech signal frame of 20 milliseconds yields a group of speech parameters in digital form. The digital speech samples 100 formed of the speech signal are coded in the speech encoder 101 in order to form a speech parameter frame. The speech encoder compresses the speech into a bit stream of 13.0 kbit/s. Of each speech frame of 20 milliseconds, the encoder forms 260 speech parameter bits which make up the speech parameter frame 102 (stage 401).

This speech parameter frame 102 is further transmitted to a channel encoder 104 for grouping the bits, for example into bits to be protected with error correction coding and into bits to be left unprotected. Further, the channel encoder is used for forming error detection information, wherein some of the speech parameters are used for its calculation.

In the speech parameter frame 102, the bits for each parameter are arranged into a descending order of importance, i.e. the most significant bits are closer to the beginning of the data frame. After this, the bits are arranged in the grouping block 103 first into an order of importance so that the most significant bits for all the bits in the speech parameter frame 102 are located at the beginning (on the left hand side) of the data frame and the least significant bits are located at the end (on the right hand side). Further, the bits are divided into three groups: the first group includes the 50 most significant bits which will be protected by channel coding at a later stage and which will be used for formation of the parity checking bits, the 132 bits of the second group are protected by channel coding but these will not be used in the formation of the parity checking bits, and the 78 bits of the third group are transmitted in the data transmission channel without protection by channel coding.

Next, the bit grouping block 103 divides the speech parameter bits into two separate classes, of which the class I comprises said bits of the first (class Ia) and second (class Ib) groups, and the class II comprises the bits of the third group. The 182 bits of class I with the subjectively greatest significance are transmitted to the block 107 for coding the error checking information. However, the 78 bits of class 11 are not protected at all. Next, three parity checking bits (CRC) of the 50 most significant bits are calculated in parity formation block 105 (stage 403). Next, the bits are arranged in the first arranging block 106 so that the most significant bits for speech in the speech parameters are placed in the better protected part in the convolutional coding (better bit error ratio), i.e. at the beginning and end of the part of the data frame to be protected (stage 404). The less significant bits and the three parity checking bits are placed in the middle of that part, where the bit error ratio is poorer. This situation is illustrated in FIG. 3a, in which the letters S indicate strongly protected bits in the error checking information, the letters W indicate weakly protected bits in the error checking information, and the letters N indicate weakly protected bits which are not used in the formation of the error checking information. There is also a curve drawn in the same FIG. 3a to illustrate the bit error probability of each bit, showing which parts of the data frame are better protected and which parts are protected more weakly.

At the end of the data frame, four tail bits are added (stage 405), for bringing the channel coder finally to a known state. At this stage, the data frame to be channel coded and having 189 bits (50+3+132+4) is transferred to the channel coder 107 with the 1/2 bit ratio (stage 406), thus giving a channel coded data frame with 378 bits.

Also the CRC bits are subjected to error correction coding 107 to secure that the error correction information is provided with maximum reliability in data transmission. In the full rate speech channel of the GSM system, the error correction coding involves convolutional coding with the bit ratio 1/2 and addition of four tail bits. The convolutional coding generates two bits of each of the 182 speech parameter bits and two bits of each of the four tail bits, as well as of each of the three CRC bits. A total of 456 bits of each speech frame of 20 milliseconds are generated at the output 111 by the transmitter. Of these, 78 bits are unprotected bits of class II and 378 bits are formed by convolutional coding 107. The outgoing bits 108 of the convolutional coding and the unprotected bits 109 are combined in a multiplexer block 110, wherein the output of the multiplexer block 110 gives a representation of 456 bits from the speech signal frame of 20 milliseconds (stage 407). The bit rate of this bit stream 111 is 22.8 kbit/s.

In the receiver, the converse operations to the said operations are carried out mainly in reverse order. FIG. 1b shows an example of such a receiver of prior art. The receiver is intended to be used as a receiver of the full rate speech channel of the GSM system. The received data frame 112, i.e. the bit string of 456 bits, is transferred to a bit reordering block 113, where the channel coded part 114 and the channel uncoded part 123 of the data frame are separated from each other. The channel coded part is transferred to the channel decoder 115, where first the decoding of the channel coded part takes place in the decoding block 116. At this stage, some of the possibly incorrect bits can be corrected, provided that the number of errors is within the error correction capacity of the error correction code. The decoded data frame 117 is transferred to the second bit reordering block 118, where the order of the bits is rearranged in the order of placement by the speech coder, i.e. the most significant bits for speech are placed on the left hand side of the data frame.

Following this, the parity checking block 119 checks if the channel decoded data frame is in order for the bits within the parity check. The parity checking block generates a selection signal 120 with a value of either true (e.g. logical 0 state) or false (e.g. logical 1 state) according to whether the data frame is in order (true) or incorrect (false). Further, the parity checking block 119 conveys the channel decoded data frame to the second output 121 of the parity checking block, from which the data frame is transmitted to the first input of the second multiplexer 122. The operation of the parity checking block 119 depends e.g. on the parity checking method used, and it is prior art known to an expert in the field.

The channel-uncoded or unprotected part 123 of the received data frame is transferred to the second input of the second multiplexer 122, wherein the output of the second multiplexer has a speech parameter frame 125 which thus in correct data transmission corresponds to the speech parameter frame 102 generated by the speech encoder 101.

From the output of the multiplexer, the speech parameter frame 125 is transferred to the first input of a selector 126. The output of a synthesisation block 124 is conducted to the second input of the selector 126. To the control input of the selector 126 is conveyed the selection signal 120 generated by the parity checking block 119, on the basis of which selection signal the selector 126 couples to the output of the selector 126 either the output of the second multiplexer 122, if the value of the selection signal 120 is true, or the output of the synthesisation block 124, if the value of the selection signal 120 is false. From the output of the selector, the speech parameter frame or the synthesised data frame is transferred to a speech decoder 127 for generating a speech signal 128.

In the system presented above, all protected bits do not have an equal bit error probability after the data frame has been subjected to error correction. This situation is typical with convolutional codes which begin and end in a known state. The bits of the beginning and end of the convolutional coded data frame have a smaller error probability than the bits located in the middle of the data frame. It is obvious that the frame error rate cannot be smaller (better) than the greatest (poorest) error rates of the bits protected by error correction. As a consequence, if an error is detected in the reception of any bit protected by error correction, this data frame is rejected in whole even though the better protected bits within the parity checking were received correctly. Thus the error correction efficiency is decreased in these situations when using currently known methods.

Errors in the convolutional decoded bit stream (117) are often found in bursts, i.e. several errors come up within a short time interval which may be followed by a longer period with no errors. Still, the average number of errors can be relatively small. This may result in the rejection of the whole data frame, although the cycle containing the burst-like error were placed in only a small part of protected bits covered by parity checking.

SUMMARY OF THE INVENTION

The purpose of the present invention is to eliminate the above-mentioned drawbacks to a great extent and to provide a more efficient method for transmission of information in the form of data frames. The invention is based on the idea of adjusting the error rate to be substantially equal among the bits covered by error correction and parity checking. The method of the invention is characterised in what will be presented in the characterising part of the appended Claim 1. The data transmission system of the invention is characterised in what will be presented in the characterising part of the appended Claim 8. The mobile station of the invention is characterised in what will be presented in the characterising part of the appended Claim 11. In other words, the invention relates to moving the error correction capacity for bits covered by error correction from the better protected bits to the more weakly protected bits. This means primarily that the frame error probability is decreased although the overall error correction capacity is not increased. The frame error rate is one of the most important factors particularly in the transmission of a speech signal. The intelligibility of the speech will decrease rapidly when frame error rate is increasing.

The invention gives significant advantages. When using coding according to the invention, the average frame error probability is better than when using currently known methods. As a result, for example the quality of speech is improved particularly under interference conditions, wherein the usability of this kind of a mobile communication system is also improved. In transmission systems using re-transmission of data frames containing errors, the need of re-transmission is reduced, wherein also unnecessary loading of the communication channel is reduced and the performance of the data transmission channel is improved.

DESCRIPTION OF THE DRAWINGS

The invention will be described more closely in the following with reference to the appended drawings, in which FIG. 3a shows a data frame coded according to prior art techniques, FIG. 3b shows a data frame coded according to an advantageous embodiment of the invention.

DETAILED DESCRIPTION OF THE PREFERRED EMBODIMENTS

Figure 2A:
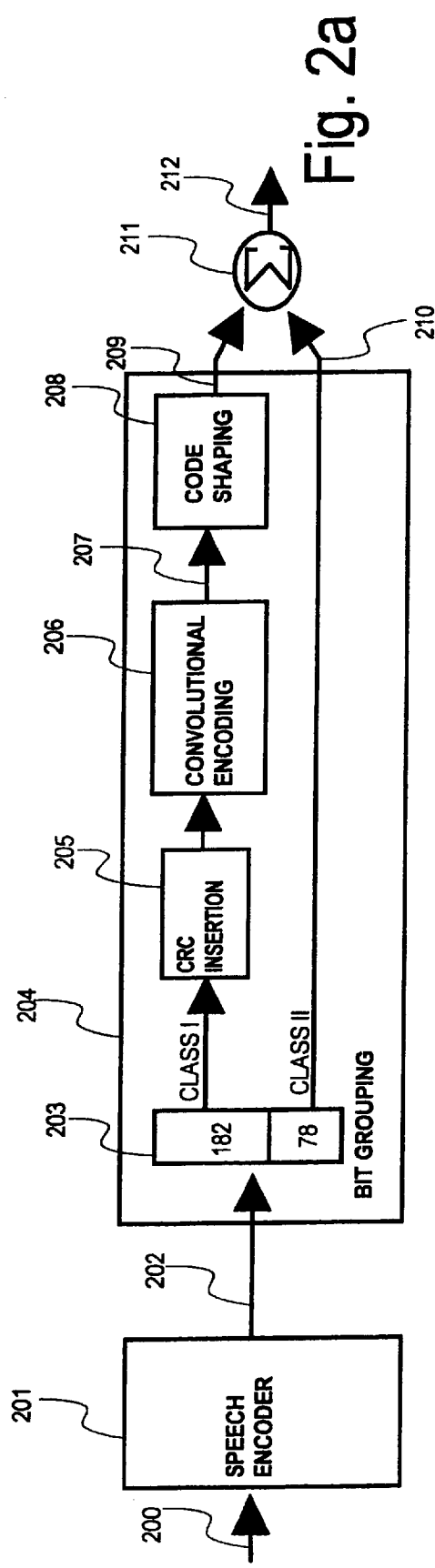
FIG. 2a is a reduced block diagram showing an advantageous embodiment of speech encoding according to the invention.

FIG. 2a is a reduced block diagram showing a device which is used for transmission of a speech signal in the GSM mobile communication system and in which the invention can be advantageously applied. The device is for example the transmitter of the speech channel of a mobile station. In the following, the operation of the method according to the invention will be described with reference to the flow chart of FIG. 5 and the device of FIG. 2a. The error-correcting encoding used in this example is convolutional encoding, and the error-checking encoding is parity calculation (CRC). It should also be mentioned that the numerical values given in this description are only examples, but the invention can also be applied in other data transmission systems involving error-correcting encoding and error-checking encoding.

In a manner known as such, the speech signal has been converted to speech frames 200 of 20 ms to be conveyed to a speech encoder 201. Of each speech frame of 20 milliseconds, the speech encoder 201 generates 260 speech parameter bits which form a speech parameter frame 202 (stage 501). For each parameter, the bits are arranged in a descending order of importance, i.e. the most significant bits are in this advantageous embodiment closer to the beginning of the data frame than the less significant bits. In the data transmission system according to the invention, there are no significant differences in the bit error ratios of those bits of the protected part of the data frame which will be used in error detecting encoding; consequently, these bits do not need to be arranged in an order of importance. Thus, it is possible to use the order in which the bits were in the speech parameter frame 202 leaving the speech encoder 201.

Further, the bits are divided into three groups: the first group consists of the 50 most significant bits which will be protected by channel coding at a later stage and on the basis of which e.g. parity checking bits are generated, the second group consists of 132 bits which will not be used in the calculation of parity checking bits but which are protected by channel coding, and the 78 bits of the third group are to be transmitted in the data transmission channel without protection by channel coding.

A bit grouping block 203 divides the speech parameter bits into two different classes in a manner corresponding to that disclosed above in this specification in connection with the description of the operation of a device of prior art. The subjectively most significant 182 bits of class I are conducted to the encoding blocks 205 and 206 of error correction and detection, but the 78 bits of class II will not be protected at all. Three parity checking bits are calculated in the parity generation block 205 from the 50 most significant bits of class I (stage 503).

Figure 5:
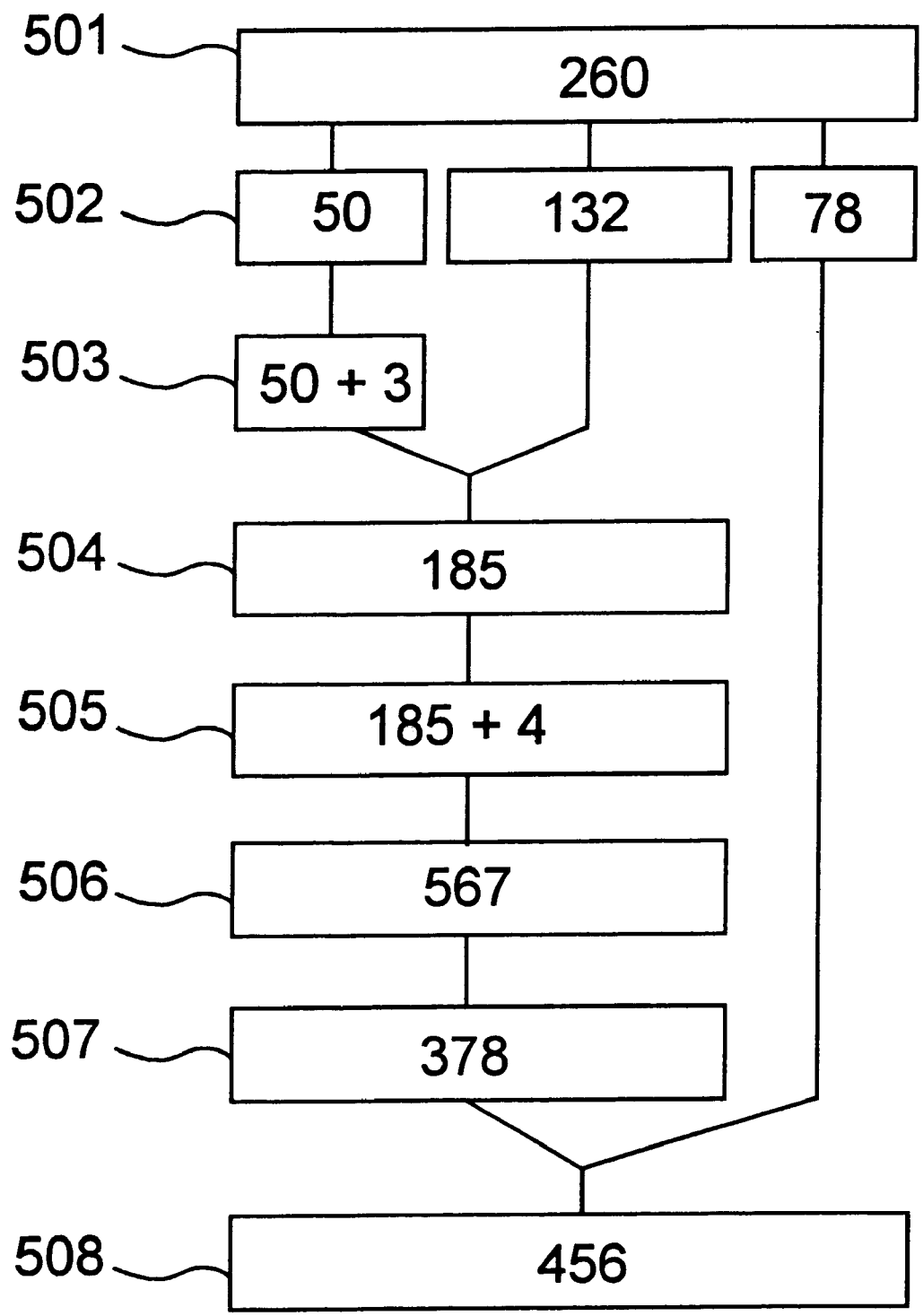
FIG. 5 is a reduced flow chart showing coding according to an advantageous embodiment of the invention.

In the flow chart of FIG. 5, the stages 501 to 503 correspond to the procedure according to prior art as described above, in other words, the formation of a speech parameter frame (stage 501), the division of the bits into three groups (stage 502), and the generation of parity checking bits (stage 503). Also in FIG. 2a, the blocks 201 and 203 of the device correspond substantially to the blocks 101 and 103 in FIG. 2a, except that in the bit grouping block 203 it is not necessary to arrange those bits that will be used in error detection encoding in an order of importance, wherein the bit grouping block 203 can be simpler than the bit grouping block 103 of devices of prior art. On the other hand, the bits can be arranged as larger entities, e.g. the order of speech parameters can be changed in a data frame.

Next (stage 504), the bits of group 1 and group 2 are combined into a data frame to be channel coded, but in a way that the placement of bits is not changed according to the order of importance. The order of the bits is thus the same as above in the data frame formed at stage 501. The parity bits are also placed in the protected part, now following immediately the information bits. Further, four tail bits are added at the end of the data frame to be channel coded (stage 505). In this embodiment example, the channel coding applies a channel coder 206 with a 1/3-rate code (stage 506), wherein in addition to the two generating polynomials a third generating polynomial is needed, as will be described below. Because the 1/3 convolutional coder generates a data frame 207 consisting of 567 bits instead of 378 bits (=3*(50+3+132+4)), some of the convolutional-coded bits must be eliminated before formation of the data frame to be transmitted to the data transmission channel. The removal of extra bits takes place in a shaping block 208 (stage 507), whose operation will be described in more detail below in this specification in connection with the description of the operation of the channel coder.

It is obvious that the invention is not limited solely to convolutional coding in the 1/3-rate code but also other rate codes can be used. The invention can also be applied in systems in which that part of the data frame to be transmitted to the data transmission channel which is protected with error correction coding is coded with convolutional coding other than in the 1/2-rate code.

The data frame 212 to be transmitted to the data transmission channel is generated in a multiplexer 211 (stage 508) to combine the convolutional coded data frame, with some of the bits deleted, and the 78 bits of the third group 210 to be transmitted without channel coding. This method can thus be used to level out the bit error rate of protected bits, wherein the probability of more correct data transmission is increased, or the frame error rate is reduced.

FIG. 3b shows bit error rates of the data frame 212 for different bits. The letters M indicate bits with medium protection and covered by error correction information, and the letters N indicate bits with the weakest protection which are not used in the generation of error checking information. The same FIG. 3b also shows a curve drawn to illustrate the bit error rate for each bit. The curve indicates at which parts of the data frame the protection is better and at which parts it is weaker.

Figure 2B:
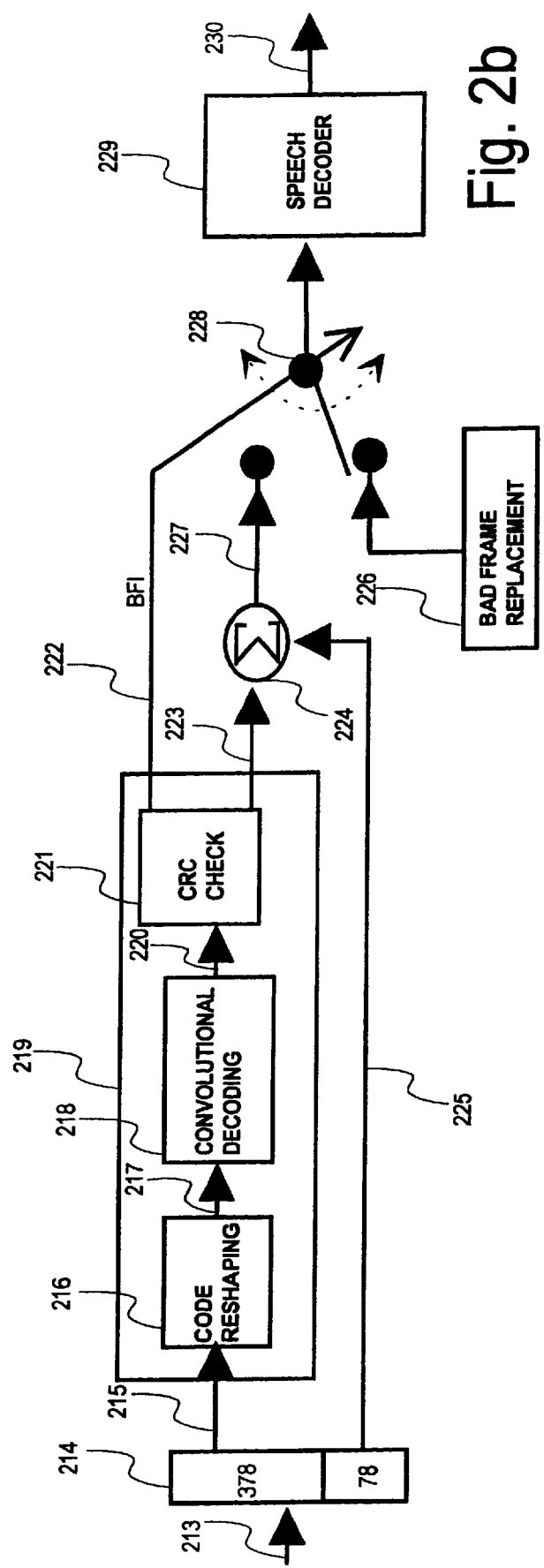
FIG. 2b is a reduced block diagram showing an advantageous embodiment of speech decoding according to the invention.
Figure 2C:
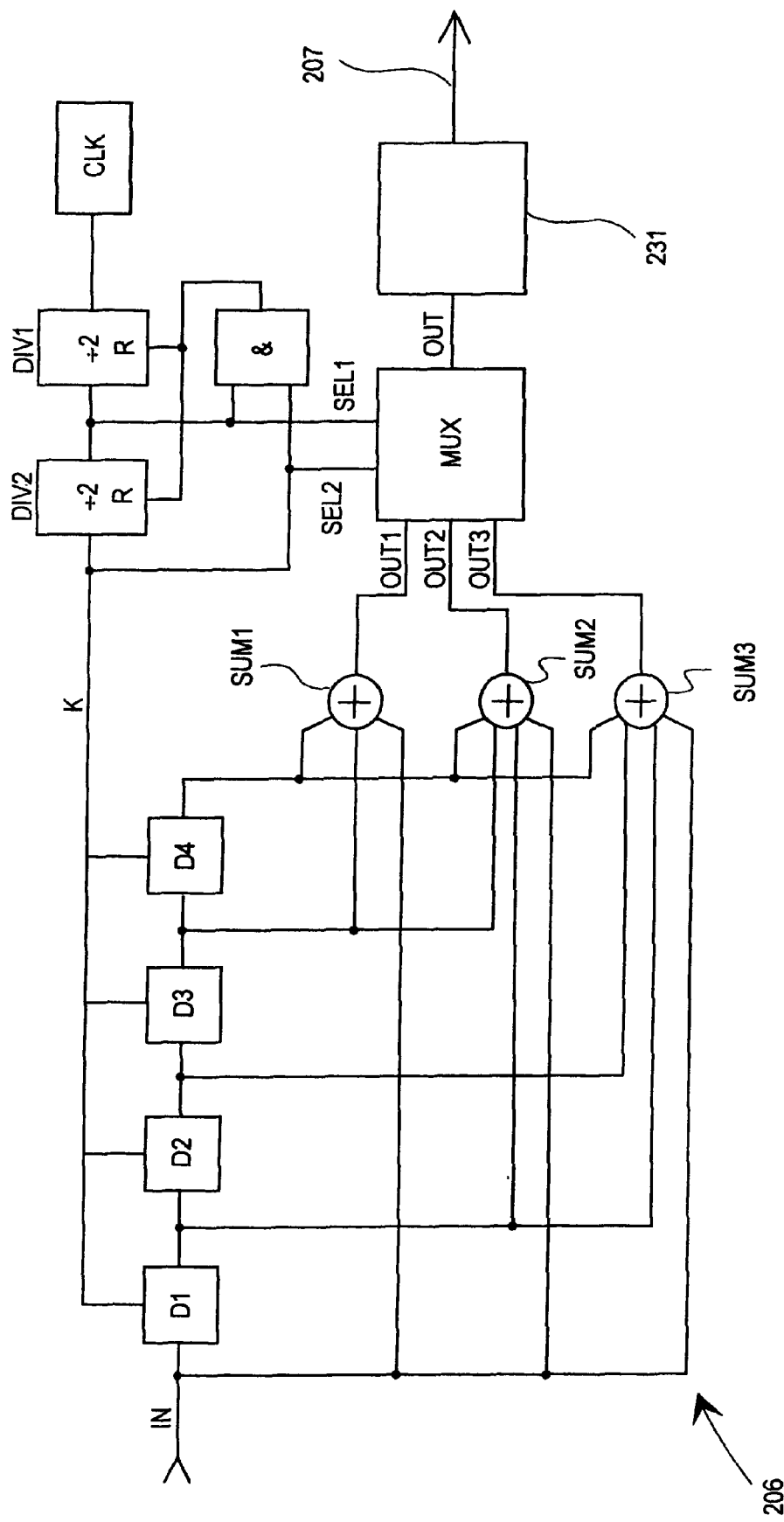
FIG. 2c is a reduced block diagram showing an advantageous embodiment of the convolutional coder according to the invention.
Figure 4:
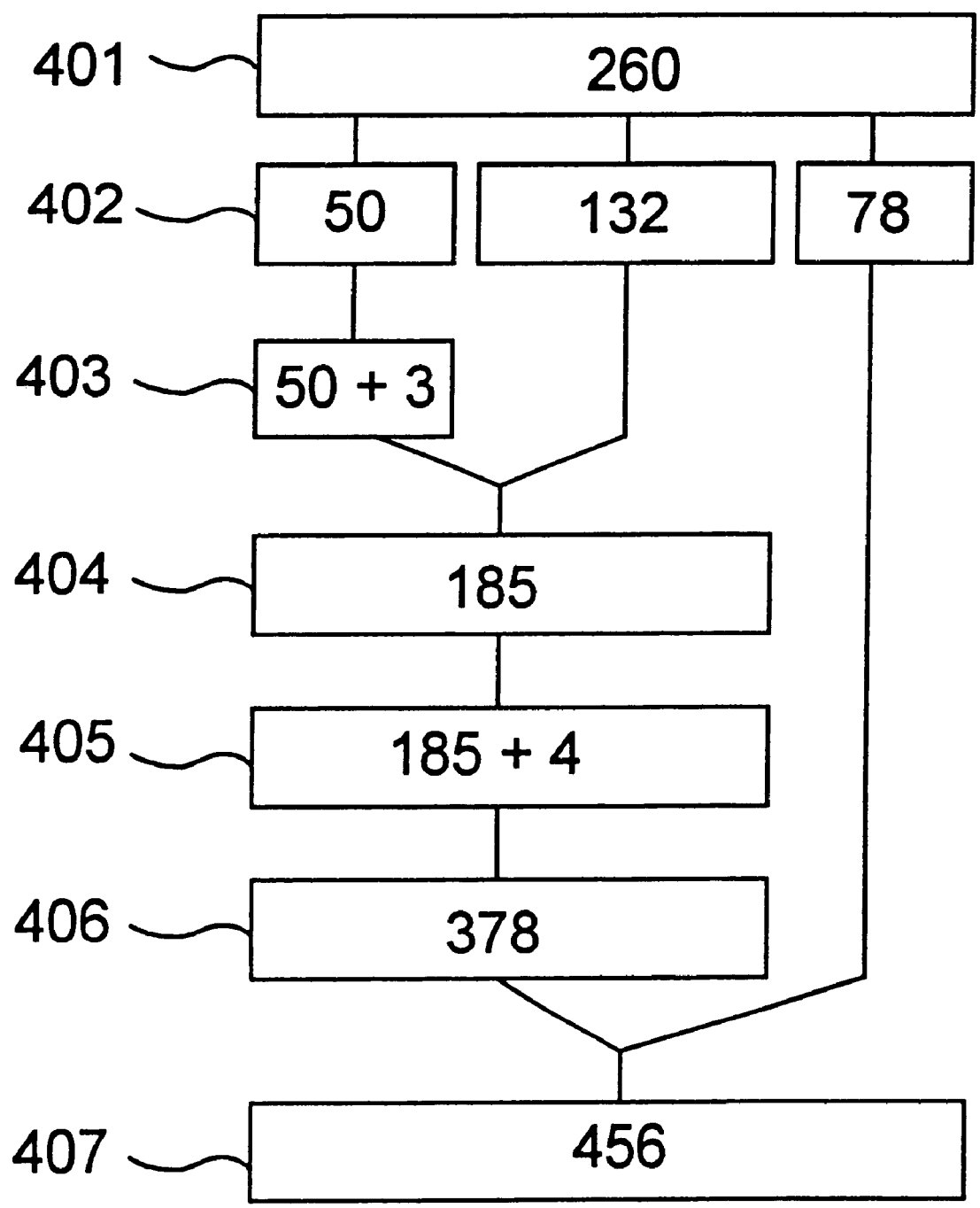
FIG. 4 is a reduced flow chart showing coding according to a prior art technique.

FIG. 2c is a reduced block diagram showing the channel coder 206. The input IN is coupled to the input of a first shift register D1 and to the first input of summers SUM1, SUM2, SUM3. The output of the first shift register D1 is coupled to the input of the second shift register D2, to the input of the second summer SUM2 and to the second input of the third summer SUM3. The output of the second shift register D2 is coupled to the input of the third shift register D3 and to the third input of the third summer SUM3. The output of the third shift register D3 is coupled to the input of the fourth shift register D4, to the second input of the first summer SUM1 and to the third input of the second summer SUM2. Further, the output of the fourth shift register D4 is coupled to the third input of the first summer SUM1, the fourth input of the second summer SUM2 and to the fourth input of the third summer SUM3. The output OUT1 of the first summer, the output OUT2 of the second summer and the output OUT3 of the third summer are coupled to the inputs of a selector MUX, wherein the output of the selector MUX forms the output OUT of the channel coder 206. The state of the first summer SUM1 depends on the state of the input IN according to the formula $a(D)(1+D^3+D^4)$, wherein $a(D)$ indicates the information to be transmitted to the input IN and $1+D^3+D^4$ is the first generating polynomial G1. In a corresponding manner, the state of the output of the second summer depends on the state of the input IN according to the formula $a(D)(1+D+D^3+D^4)$, wherein $1+D+D^3+D^4$ is the second generating polynomial G2. In channel coding according to the invention, preferably also a third generating polynomial G3 is used, which is for example $1+D+D^2+D^4$, i.e. the state of the output of the third summer depends on the state of the input IN according to the formula $a(D)(1+D+D^2+D^4)$. In the generation polynomials G1, G2, G3, the index D indicates the state of the input IN at a moment t−1 (=the state of the output of the first shift register D1), $D^2$ indicates the state of the input IN at a moment t−2 (=the state of the output of the second shift register D2), $D^3$ indicates the state of the input IN at a moment t−3 (=the state of the output of the third shift register D3), and $D^4$ indicates the state of the input IN at a moment t−4 (=the state of the output of the fourth shift register D4). The output of the summer SUM1, SUM2, SUM3 is at state 1 when there are an odd number of states 1 in the inputs of the summer SUM1, SUM2, SUM3. In other cases, the output of the summer SUM1, SUM2, SUM3 is in the state 0.

Consequently, the channel coder is a kind of state machine, in which the output of the channel coder is affected by not only the bit to be coded at the time but also some of the states of previously coded bits.

Further, the block diagram of FIG. 2c shows a timing circuit CLK e.g. for transferring the information in the input of each shift register D1, D2, D3, D4 to the output of the shift register D1, D2, D3, D4 as well as for generating control signals SEL1, SEL2, by means of which the selector MUX selects to the output OUT the signal in the first, second or third input in the selector MUX, i.e. the state of the output of the first summer SUM1, the second summer SUM2 or the third summer SUM3. For example when the first control signal SEL1 and the second control signal SEL2 of the selector are in the 0 state, i.e. more briefly expressed the selection signal SEL1, SEL2 is in 00 state, the output of the selector MUX is in the state of the first summer SUM1. When the first control signal SEL1 of the selector is in the 1 state and the second control signal SEL2 is in the 0 state, i.e. more briefly expressed the selection signal SEL1, SEL2 is in 10 state, the output of the selector MUX is in the state of the second summer SUM2. When the first control signal SEL1 of the selector is in the 0 state and the second control signal SEL2 is in the 1 state, i.e. more briefly expressed the selection signal SEL1, SEL2 is in 01 state, the output of the selector MUX is in the state of the third summer SUM3. The control signals SEL1, SEL2 are formed for example by coupling two dividers-by-two DIV1, DIV2, known as such, in a way that to the input of the first divider DIV1 is transmitted preferably a pulse sequence whose frequency is three times the frequency of the triggering signal K of the shift registers D1, D2, D3, D4, the output of the first divider DIV1 is coupled to the input of the second divider DIV2, and the dividers are set to their initial state after every third clock pulse. In the example coupling of FIG. 2, this is implemented in a way that the output of the timing circuit CLK is coupled to the control input of the selector MUX and to the input of the first divider DIV1. The output of the second divider DIV2 is coupled to the triggering inputs of the shift registers D1, D2, D3, D4. The timing can also be implemented in other methods known as such to an expert in the field, for example using an application program of a microprocessor.

The operation of the channel coder 206 is further described by using as an example the data frame a(D), whose information is the bit sequence 0101 and tail bit string is 0000, in which 0 indicates the logical 0 state and 1 indicates the logical 1 state. In practical applications, the logical 0 state is most usually a voltage value of ca. 0 V and the logical 1 state is in a corresponding manner approximately the operating voltage, for example 3.3 V. The bit sequence is demonstrated chronologically to proceed from the left to the right, so that the first bit is 0. The information a(D) is transmitted to the input IN of the channel coder 206. Thus, the output OUT1 of the first summer is in the 0 state and the output of the other summers OUT2, OUT3 is also in the 0 state, presumed that the shift registers D1, D2, D3, D4 are initially in the 0 state. During the 00 state, 10 state and 01 state of the selection signal SEL1, SEL2, the output of the selector MUX is in the 0 state, wherein the bit sequence 000 is generated in the output of the channel coder 206. The next incoming bit is 1, and the shift registers D1, D2, D3, D4 are in the 0 state, wherein the output OUT1, OUT2, OUT3 of each summer is in the 1 state. Thus, during the different states of the selection signal SEL, the output of the selector MUX is in the 1 state, wherein the bit sequence 111 is generated in the output of the channel coder 206. The next bit is 0, the first shift register D1 is in the 1 state, and the second D2, third D3 and fourth shift register D4 are in the 0 state. Thus, the bit sequence 011 is generated in the output of the channel coder 206. The fourth bit is 1, the first shift register D1 is in the 0 state, the second shift register D2 is in the 1 state, the third shift register D3 is in the 0 state, and the fourth shift register D4 is in the 0 state. Thus, the bit sequence 110 is generated in the output of the channel coder 206. With the bits of the tail part, the output comprises the bit sequence 101110110110. The meaning of the tail part is here e.g. that even the last information bit has passed through the shift registers D1, D2, D3, D4 of the channel coder. To obtain this, the shift registers D1, D2, D3, D4 of the channel coder are stepped at least four times after the last information bit, wherein the length of the tail part should be at least four. Consequently, in this example the data frame a(D) 01010000 is encoded into the bit sequence 000111011110101110110110.

In the convolutional encoder 206 with the 1/3-rate code as presented above, three output bits are thus generated for each input bit. The length of the data frame to be transmitted to the data transmission channel should, however, be the same as in coding according to prior art; consequently, some of the bits to be formed by convolutional coding must be removed before the data frame can be transmitted to the data transmission channel. One selection method is shown in Table 1, in which the numeral 1 indicates the inclusion of said bit in the data frame and the numeral 0 indicates rejection of the bit correspondingly. The numbers are grouped in groups of three, wherein the first numeral indicates the output of the first summer SUM1, the second numeral indicates the output of the second summer SUM2 and the third numeral indicates the output of the third summer SUM3. In this example, there are 189 groups, i.e. 182+3+4 (182 bits to be protected, 3 parity checking bits calculated from the 50 most significant bits to be protected, and 4 tail bits). For example in the four first groups, only the output of the first summer SUM1 is selected, in the following five groups the outputs of the first summer SUM1 and the second summer SUM2 are selected, in the tenth group the outputs of all three summers SUM1, SUM2, SUM3 are selected, etc. The number of numerals 1 in the Table is 378, wherein the final result gives a data frame of the same length as the data frame coded according to prior art methods for use in the transmission of a speech signal in the GSM system. In this example, the Table is formed in a way that the number of numerals 1, i.e. the number of bits to be included, is greater at the beginning than at the end. As a result, the error correction capacity is better at the beginning than at the end of the data frame.

TABLE 1

|    | 1       | 2       | 3       | 4       | 5       | 6       |
|----|---------|---------|---------|---------|---------|---------|
| 1  | 1, 0, 0, | 1, 0, 0, | 1, 0, 0, | 1, 0, 0, | 1, 1, 0, | 1, 1, 0, |
| 2  | 1, 1, 0, | 1, 1, 0, | 1, 1, 0, | 1, 1, 1, | 1, 1, 0, | 1, 1, 0, |
| 3  | 1, 1, 0, | 1, 1, 0, | 1, 1, 0, | 1, 1, 1, | 1, 1, 0, | 1, 1, 0, |
| 4  | 1, 1, 0, | 1, 1, 0, | 1, 1, 0, | 1, 1, 0, | 1, 1, 0, | 1, 1, 0, |
| 5  | 1, 1, 0, | 1, 1, 0, | 1, 1, 0, | 1, 1, 1, | 1, 1, 0, | 1, 1, 0, |
| 6  | 1, 1, 0, | 1, 1, 0, | 1, 1, 0, | 1, 1, 1, | 1, 1, 0, | 1, 1, 0, |
| 7  | 1, 1, 0, | 1, 1, 0, | 1, 1, 0, | 1, 1, 0, | 1, 1, 0, | 1, 1, 0, |
| 8  | 1, 1, 0, | 1, 1, 0, | 1, 1, 0, | 1, 1, 1, | 1, 1, 0, | 1, 1, 0, |
| 9  | 1, 1, 0, | 1, 1, 0, | 1, 1, 0, | 1, 1, 1, | 1, 1, 0, | 1, 1, 0, |
| 10 | 1, 1, 0, | 1, 1, 0, | 1, 1, 0, | 1, 1, 0, | 1, 1, 0, | 1, 1, 0, |
| 11 | 1, 1, 0, | 1, 1, 0, | 1, 1, 0, | 1, 1, 1, | 1, 1, 0, | 1, 1, 0, |
| 12 | 1, 1, 0, | 1, 1, 0, | 1, 1, 0, | 1, 1, 1, | 1, 1, 0, | 1, 1, 0, |
| 13 | 1, 1, 0, | 1, 1, 0, | 1, 1, 0, | 1, 1, 0, | 1, 1, 0, | 1, 1, 0, |
| 14 | 1, 1, 0, | 1, 1, 0, | 1, 1, 0, | 1, 1, 1, | 1, 1, 0, | 1, 1, 0, |
| 15 | 1, 1, 0, | 1, 1, 0, | 1, 1, 0, | 1, 1, 0, | 1, 1, 0, | 1, 1, 0, |
| 16 | 1, 1, 0, | 1, 1, 0, | 1, 1, 0, | 1, 1, 0, | 1, 1, 0, | 1, 1, 0, |
| 17 | 1, 1, 0, | 1, 1, 0, | 1, 1, 0, | 1, 1, 0, | 1, 1, 0, | 1, 1, 0, |
| 18 | 1, 1, 0, | 1, 1, 0, | 1, 1, 0, | 1, 1, 0, | 1, 1, 0, | 1, 1, 0, |
| 19 | 1, 1, 0, | 1, 1, 0, | 1, 1, 0, | 1, 1, 0, | 1, 1, 0, | 1, 1, 0, |
| 20 | 1, 1, 0, | 1, 1, 0, | 1, 1, 0, | 1, 1, 0, | 1, 1, 0, | 1, 1, 0, |
| 21 | 1, 1, 0, | 1, 1, 0, | 1, 1, 0, | 1, 1, 0, | 1, 1, 0, | 1, 1, 0, |
| 22 | 1, 1, 0, | 1, 1, 0, | 1, 1, 0, | 1, 1, 0, | 1, 1, 0, | 1, 1, 0, |
| 23 | 1, 1, 0, | 1, 1, 0, | 1, 1, 0, | 1, 1, 0, | 1, 1, 0, | 1, 1, 0, |
| 24 | 1, 1, 0, | 1, 1, 0, | 1, 1, 0, | 1, 1, 0, | 1, 1, 0, | 1, 1, 0, |
| 25 | 1, 1, 0, | 1, 1, 0, | 1, 1, 0, | 1, 1, 0, | 1, 1, 0, | 1, 1, 0, |
| 26 | 1, 1, 0, | 1, 1, 0, | 1, 1, 0, | 1, 1, 0, | 1, 1, 0, | 1, 1, 0, |
| 27 | 1, 1, 0, | 1, 1, 0, | 1, 1, 0, | 1, 1, 0, | 1, 1, 0, | 1, 1, 0, |
| 28 | 1, 1, 0, | 1, 1, 0, | 1, 1, 0, | 1, 1, 0, | 1, 1, 0, | 1, 1, 0, |
| 29 | 1, 1, 0, | 1, 1, 0, | 1, 1, 0, | 1, 1, 0, | 1, 1, 0, | 1, 1, 0, |
| 30 | 1, 1, 0, | 1, 1, 0, | 1, 1, 0, | 1, 1, 0, | 1, 1, 0, | 1, 1, 0, |
| 31 | 1, 1, 0, | 1, 1, 0, | 1, 1, 0, | 1, 1, 0, | 1, 0, 0, | 1, 0, 0, |
| 32 | 1, 0, 0, | 1, 0, 0, | 1, 0, 0, |         |         |         |

In the data frame, the selection of bits to be transmitted can be implemented e.g. in a way that the output signal OUT of the multiplexer is conducted to a selection block 231, in which a selection is made in groups of three, which of these three values, namely the outputs OUT1, OUT2, OUT3 of the summers, is included to the data frame to be transmitted. In the selection block 231, the table can be compiled e.g. in the read-only-memory (ROM), or a program can be written up in which the selection rule is programmed. The implementation of the ROM table takes place e.g. in a way that each group of three is placed in an address of its own, in which one bit corresponds to one numeral in the group for example in a way that the bit 0 corresponds to the first numeral in the group, the bit 1 to the second numeral, and the bit 2 to the third numeral. ROM circuits have usually the width of eight bits, i.e. a byte having the width of eight bits can be stored in one address. Thus, in this embodiment, the read only memory used should have a memory space of at least 567 bytes. Reading the table is advantageously controlled by a microprocessor whose application software includes the above-mentioned operations for reading and comparing the table, which is prior art known to an expert in the field.

Figure 1A:
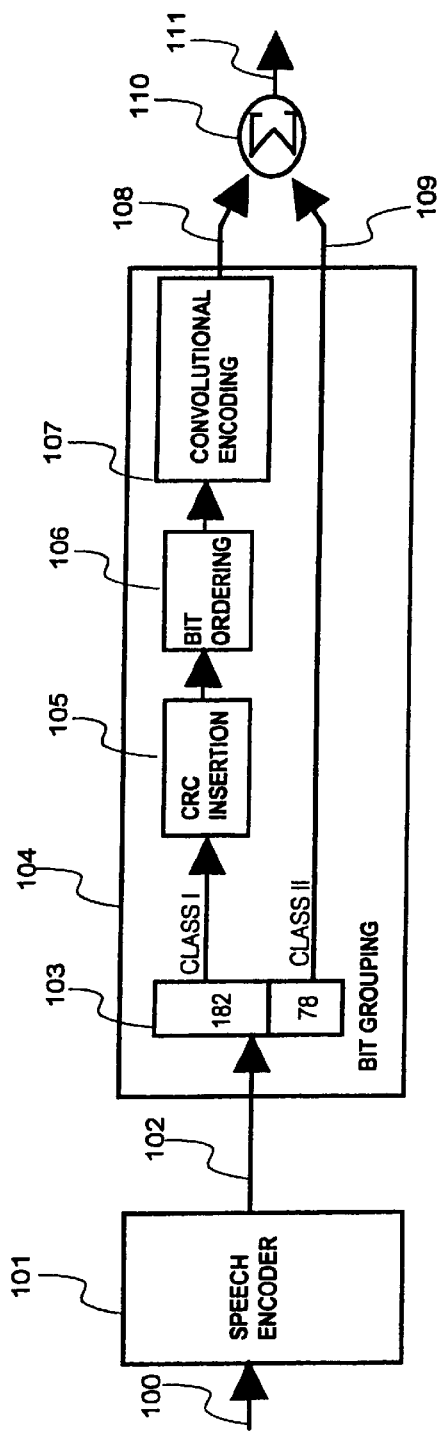
FIG. 1a is a reduced block diagram illustrating speech encoding according to prior art techniques.
Figure 1B:
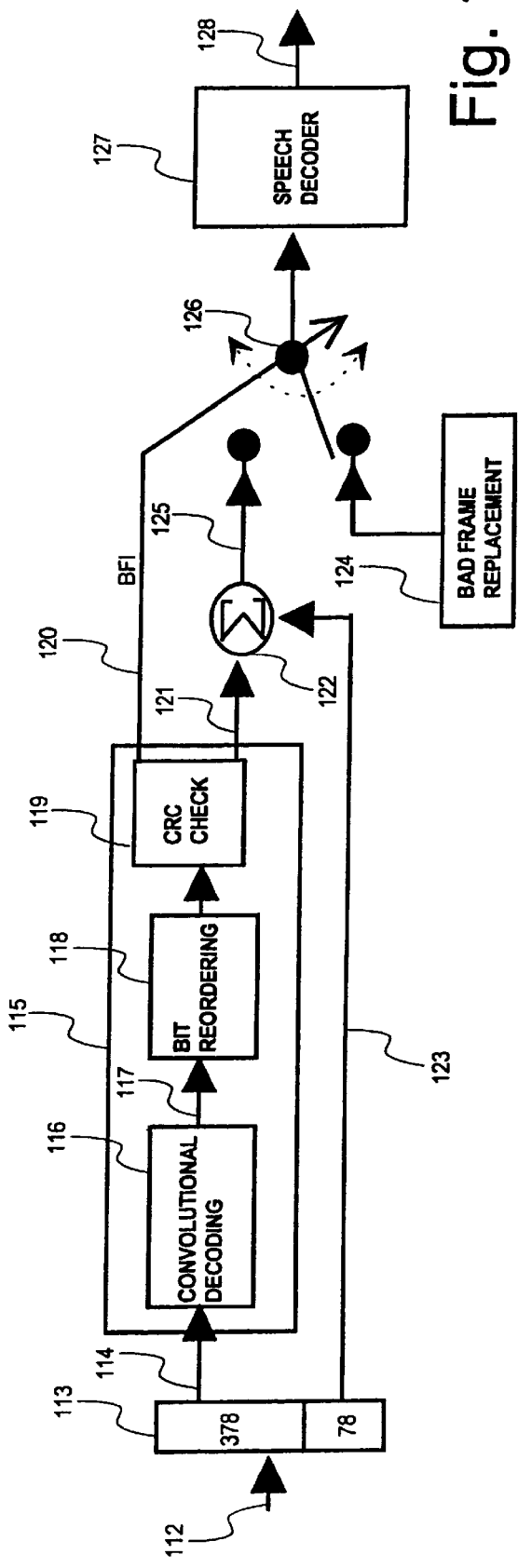
FIG. 1b is a reduced block diagram illustrating speech decoding according to prior art techniques.

In the receiver, the operations converse to the operations mentioned above are conducted mainly in the reverse order. FIG. 2b shows an example of such a receiver according to an advantageous embodiment of the invention. The receiver is intended as a receiver of the full rate speech channel in the GSM system, and it corresponds in its functions mainly to the receiver of FIG. 1b. The receiver is for example the receiver of the speech channel of a mobile station. The operation of the receiver of FIG. 2b will be described in the following.

The received data frame 213, i.e. the bit sequence of 456 bits, is passed to a bit grouping block 214, in which the channel coded part 215 and the channel uncoded part 225 are separated from each other in the data frame. The channel coded part is passed to the channel decoder 219, where the bits corresponding to the bits removed in the shaping block 208 at the transmission stage are added to the channel coded part in a reshaping block 216. The values of the removed bits are not known in the receiver, but these can be replaced e.g. by setting the value of the bits to 0.5 which is neutral to the decoder.

The reshaping block 216 contains a table with a similar content to that in the shaping block 208, wherein the reshaping block 216 knows at which points the missing bits must be added. The implementation of the table can also in the receiver be based on e.g. a ROM table.

Thus the decoding block 218 conducts decoding of the data frame 217 reconstructed by the reshaping block 216, i.e. of the channel-coded part to which the missing bits have been added. At this stage, it is possible to correct some of the possible data transmission errors, provided that the number of errors is within the error correction capacity of the error correction code. In the decoded data frame 220, the bit order corresponds to that placed by the speech coder, i.e. the most significant bits for the speech are on the left side of the data frame. Thus, no reorganisation of bits will be needed as in a device according to prior art.

Following this, the parity checking block 221 checks whether the channel-decoded data frame 220 is in order for the bits covered by parity checking. The parity checking block generates a selection signal 222 whose value is either true (e.g. logical 0 state) or false (e.g. logical 1 state) according to whether the data frame is in order (true) or incorrect (false). Further, the parity checking block 221 transmits the channel-decoded data frame to the second output 223 of the parity checking block, from which the data frame is passed to the first input of the second multiplexer 224.

To the second input of the second multiplexer 224 is passed the channel-uncoded or unprotected part 225 of the received data frame, wherein the output of the second multiplexer contains a speech parameter frame 227 which thus in correct data transmission corresponds to the speech parameter frame 202 formed by the speech coder 201. From the output of the multiplexer, the speech parameter frame 227 is conducted to the first input of a selector 228. The output of a synthesising block 226 is passed to the second input of the selector 228. To the control input of the selector 228 is conducted the selection signal 222 generated by the parity checking block 221, on the basis of which the selector 228 couples to the output of the selector 228 either the output of the second multiplexer 224, if the value of the selection signal 222 is true, or the output of the synthesising block 226, if the value of the selection signal 222 is false. From the output of the selector, the speech parameter frame or the synthesised data frame is conducted to a speech decoder 229 for formation of a speech signal 230.

In the method according to the invention, the bits to be protected by error correction coding and used in error correction are advantageously placed either at the beginning or at the end of the data frame. Preferably to the immediate vicinity of these bits is placed the error detection information, such as the parity checking bits generated at stage 503. This arrangement will reduce the probability that a burst-like error at the beginning or end will make the entire data frame unusable. A sufficient number of most significant bits may be correct, wherein it is possible to use them to generate a data frame almost corresponding to the original.

Although the invention was described above in connection with the full-rate speech channel of the GSM mobile communication system, the invention is not limited solely to the embodiments presented above but it can be modified within the scope of the appended claims. It is advantageous to apply the invention in data transmission systems in which the data frames to be transmitted are subjected to error correction coding, in which the bit error ratio is not even in the entire data frame, and also part of the information to be transmitted is used in the formation of the error detection information.

What is claimed is:

1. A method for decreasing frame error rate of information to be transmitted in the form of data frames in a data transmission system, in which
   the information to be transmitted is divided into data frames,
   the data frame is supplemented with error detection data generated by using part of the information to be transferred, at least part of the information to be used in the generation of error detection data is protected by error correction coding, by which an error correction coded data frame is obtained, in which at least some parts have different error correction capability, and
   the error correction coded data frames are transferred in the data transmission channel from the transmitter to the receiver,
wherein the error correction capability of at least part of the protected information is levelled out.

2. A method according to claim 1, in which the information to be transmitted is in binary form, wherein the data frames (102, 202) consist of bits, and the error rates of the bits in said information part (207) is adjusted to be substantially equal at the transmission stage.

3. A method according to claim 2, wherein the mutual order of bits in the part of the data frame which contains those bits to be protected by error correction coding that are to be used in error detection coding, can be placed in said part of the data frame freely, irrespective of the mutual order of importance of said bits.

4. A method according to claim 1, in which the information to be transmitted is in binary form, wherein the data frames (102, 202) consist of bits, and some of the bits in the error correction coded data frame (207) are removed during the shaping.

5. A method according to claim 4, and the error correction coding is convolutional coding, and the error detecting coding is parity checking coding (CRC).

6. A method according to claim 5, and the convolutional coding is 1/3 convolutional coding, and that one third of the convolutional coded data frame is removed during the shaping.

7. A method according to claim 5, wherein the information part (207) to be used in the generation of error detecting data is placed either at the beginning or at the end of the protected information part in the data frame (212) to be transmitted to the data transmission channel.

8. A method according to claim 5, where the shaping is implemented by unevenly removing bits of the error correction coded data frame.

9. A method according to claim 8, wherein relatively more bits are removed at the beginning of the convolutional code.

10. A method according to claim 8, wherein more bits are removed in data not used in the error detection coding.

11. A data transmission system, in which information is transmitted in the form of data frames, the data transmission system comprising:

means (101, 201) for distributing the information to be transmitted into data frames (102, 202), means (105, 205) for adding error detection data into the data frame (102, 202), and means (107, 206) for protecting at least part of the information to be used in the generation of error detection data with error correction coding in order to achieve an error correction coded data frame (108, 207), in which at least some parts have different error correction capability, wherein the data transmission system further comprises means (208) for levelling out error correction capability of at least one part of the protected information.

12. Data transmission system according to claim 11, wherein the means (208) for levelling out error rates of at least one part of the protected information comprise means (208) for shaping at the transmission stage at least part of the information part (207) protected with error correction coding and which is used in the generation of the error detection data.

13. A data transmission system according to claim 11, wherein the data transmission system is a GSM mobile communication system, and that the information to be transmitted is information of the speech channel.

14. A mobile station comprising:

means (101, 201) for dividing the information to be transmitted into data frames (102, 202), means (105, 205) for adding error correction data into the data frame (102, 202), and means (107, 206) for protecting at least part of the information to be used in the generation of error detection data with error correction coding in order to achieve an error correction coded data frame (108, 207), in which at least some parts have different error correction capability, wherein the mobile station comprises further means (208) for levelling out error correction capability of at least one part of the protected information.

* * * * *